United States Patent [19]

Mee et al.

[11] Patent Number: 4,710,715
[45] Date of Patent: Dec. 1, 1987

[54] METHOD OF MAPPING MAGNETIC FIELD STRENGTH AND TIPPING PULSE ACCURACY OF AN NMR IMAGER

[75] Inventors: Gary L. Mee; M. Robert Willcott, both of Houston, Tex.

[73] Assignee: NMR Imaging, Inc., Houston, Tex.

[21] Appl. No.: 726,086

[22] Filed: Apr. 23, 1985

[51] Int. Cl.⁴ .............................................. G01R 33/24
[52] U.S. Cl. ..................................... 324/307; 324/300
[58] Field of Search ............... 324/300, 307, 309, 314, 324/320, 301

[56] References Cited

U.S. PATENT DOCUMENTS 4,551,680 11/1985 Macovski ............................ 324/309
4,585,992 4/1986 Maudsley et al. .................. 324/309

Primary Examiner—Stewart J. Levy
Assistant Examiner—Kevin D. O'Shea
Attorney, Agent, or Firm—Vaden, Eickenroht, Thompson & Boulware

[57] ABSTRACT

A method is disclosed for superimposing field strength gradients on the image produced by an NMR imager by using a preparation step of tipping the spins of the volume elements with a 90° wait 90° RF pulse sequence for each data collection pass and performing the image encoding and data collection required to obtain the desired data set and transforming the data set into a planar image. A method is also disclosed for superimposing gradients on such an image indicative of the accuracy of the tipping process of an NMR imager.

2 Claims, 8 Drawing Figures

METHOD OF MAPPING MAGNETIC FIELD STRENGTH AND TIPPING PULSE ACCURACY OF AN NMR IMAGER

This invention relates to NMR imagers generally and, in particular, to a method of checking the homogeneity of the magnetic field, $H_o$, the accuracy of the RF pulses used to tip the spins to the desired angle, and the physical orthogonal positions of the magnet and the RF coil.

It is well known that distortions in the magnetic field, $H_o$, in an NMR imager must be kept to a minimum and, if at all possible, out of the region of interest. In the past, $H_o$ field maps were made by taking many NMR measurements, recording the results, and plotting the geometric location of the NMR sample versus field strength. This is a time consuming and not very accurate method of preparing a $H_o$ field map for an NMR imager.

What is needed is a method of producing contour lines of equal field strength directly on the image of a specimen or phantom obtained from the NMR imager. It is an object of this invention to provide such a method.

Many benefits result from the ability to obtain a contour map of the magnetic field in accordance with the method of this invention. The process of preparing and computing an image can be done in less than one minute. This allows magnet adjustment, either mechanical or electrical, to be monitored as the adjustments are made and will allow the magnet to be adjusted to the extent possible to remove as many field inhomogeneities as possible out of the region of interest. The method then can serve as an engineering quality control tool. It can also be used to check precisely the deleterious effects of moving large metal masses and/or other magnets near the NMR system.

These and other objects, advantages, and features of this invention will be apparent to those skilled in the art from a consideration of this specification including the attached drawings and appended claims.

IN THE DRAWINGS

All NMR imaging techniques can be resolved into two operations. The first is a preparation sequence, which is the same for each data collection pass. The second operation is an image encoding sequence, which is different for each data collection pass with the exception of repetitions for signal averaging.

The imaging sequence is made up of a sequence of one or more repetitions of preparation followed by image encoding and data collection. Echo planar imaging takes a single preparation sequence and encodes a two-dimensional image on top of it. A 2D FT or planar projection reconstruction takes several hundred preparations and encodes each one differently to achieve a data set that can be transformed mathematically into a planar image. A sensitive point imaging method may require several tens of thousands of preparations followed by encoding and data collection to make the same planar image.

The common factor to all of these and other imaging methods is that the sample in the imager must first have its spins coherently aligned perpendicular to the magnetic field before any of the encoding techniques can be applied to them to make an image. The preparation phase of the imaging sequence can be used to enhance certain contrasts in $T_1$ and $T_2$ as in an inversion recovery sequence, but its main purpose is to deliver coherent spins from the entire sample or a known plane of the sample to the image encoding portion of the imaging sequence.

In accordance with the method of this invention for plotting of magnetic field strength contours, a different preparation phase is used with the existing imaging sequence. This preparation step will cause an image produced by the system, such as that of a uniform doped water phantom to have superimposed on it an intensity modulation that varies periodically with the strength of the magnetic field present during this preparation sequence. Basically, the number of coherent spins delivered to the image encoding sequence is dependent on a periodic function of the magnetic field they experience during preparation. Since the field experienced is also a function of the position of the phantom in the magnet, these intensities after image encoding and processing will present a contour map of the magnetic field strength in which the phantom is located.

Figure 1:
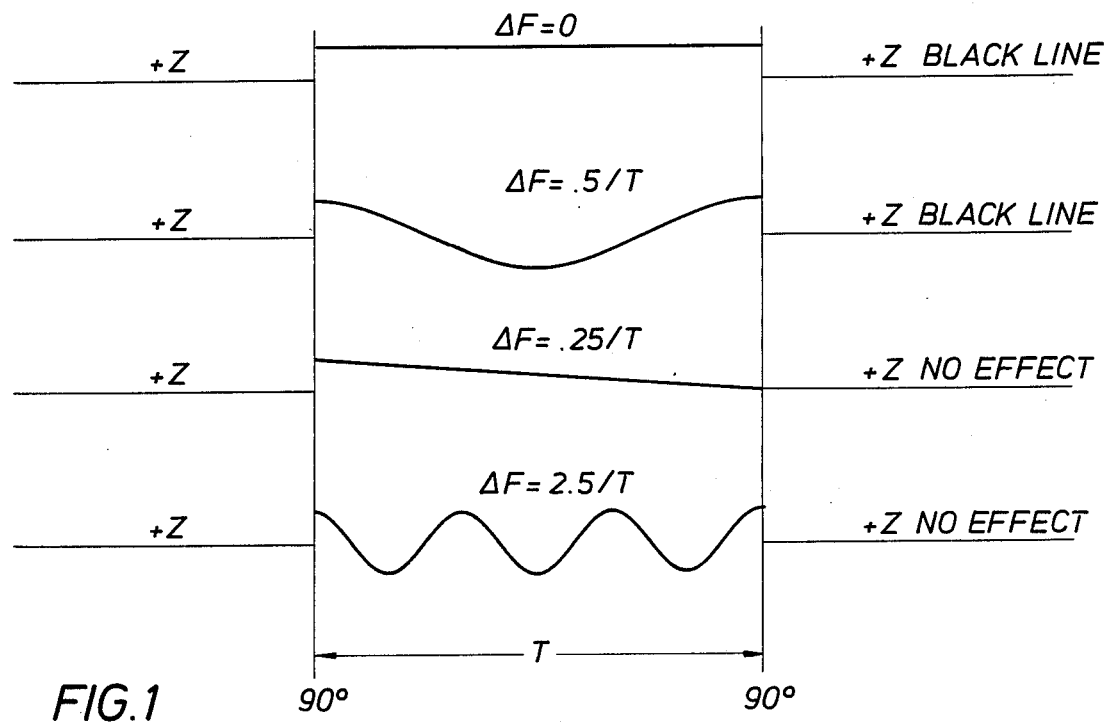
FIG. 1 is a schematic diagram of the effect of the preparation step used in this invention of the spins of volume elements located in regions of different magnetic fields.

The usual preparation sequences for NMR imagers are either a single ninety degree tip of the spins, for spin echo or partial saturation, or a 180 degree tip followed by a waiting period and a ninety degree tip, in inversion recovery. These sequences present spins to be imaged more or less independent of the exact value of the magnetic polarization field. By preparing with a 90 wait-90 sequence, the spins left for imaging are quite dependent on the precession frequency of the spins, hence the magnetic field strength, (see FIG. 1). The period of the frequency dependence is directly determined by the length of the waiting period, hence it is related directly to the magnetic field strength by the gyromagnetic ratio of the nuclei involved in the imaging experiment.

Additionally a 90 T90 $_a$ T90 $_b$ preparation sequence takes spins which did not show on the 90—90 sequence because they were rotated into the axis of $H_o$ or $-H_o$ by the second 90° pulse and rotates them back into the observable plane where they obtain coherence at a time $T_a$ after the third 90° pulse. If $T_a=T_b$ the image obtained will be the inverse of the image obtained by the 90—90 sequence. If $T_b \neq T_a$, the image will vary periodically as the sum of two frequencies $$\Delta \frac{F}{T_a} + \Delta \frac{F}{T_b},$$

this is useful in the case where $T_b=N+T_a$ by causing a superimposed fine contour picture on top of a coarse scale contour picture with N variations of the fine contour lines between coarse contour lines.

Figure 2:
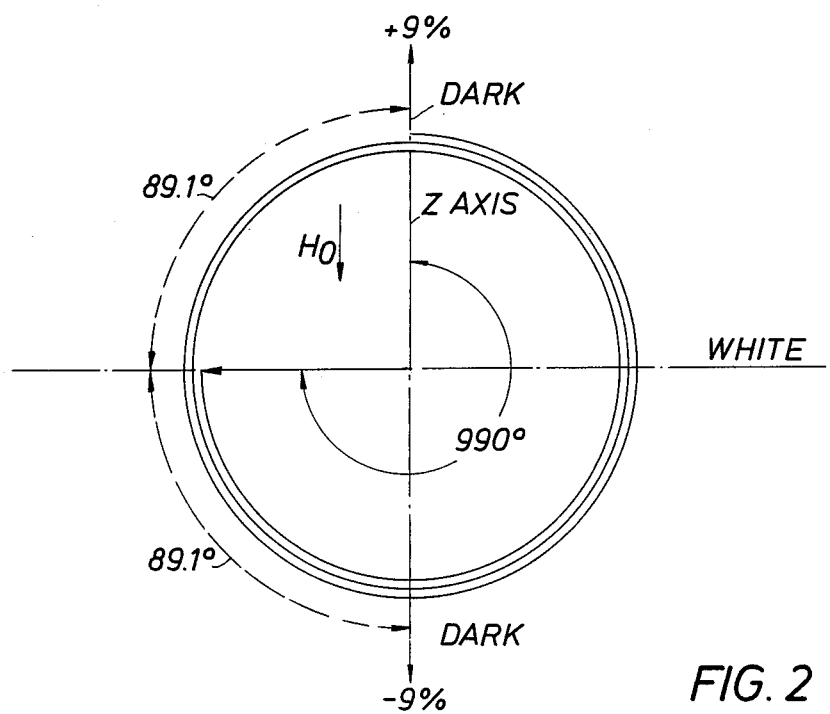
FIG. 2 is a schematic diagram indicating the rotation of the spins through 990° and the cumulative errors in the tipping accuracy of the RF pulses that are measured thereby using the method of this invention.
Figure 3A:
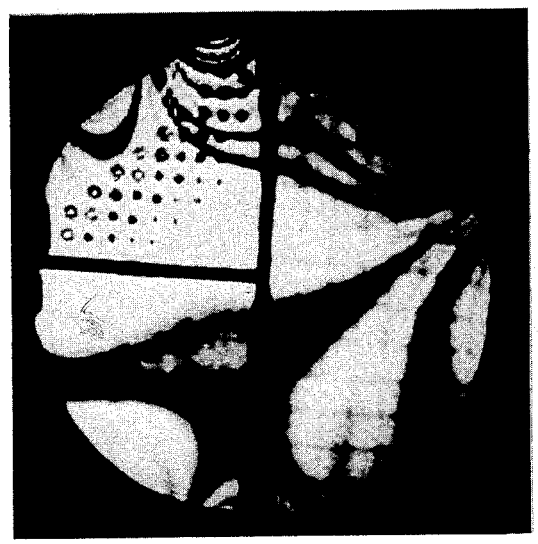
FIG. 3A is an image through a phantom positioned in an NMR imager using the method of this invention to produce contours of equal magnetic field strength on the image.
Figure 3B:
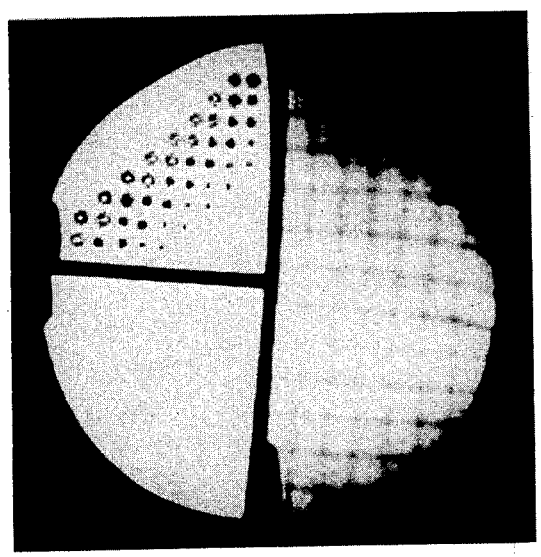
FIG. 3B is an image of the same phantom from the same NMR imager using conventional imaging techniques to allow the distortion in the image to be compared with the contour lines of the magnetic field shown in FIG. 3A.

Similar methods of spin preparation can be used to check the accuracy of the structural arrangement of the imager and the performance of the RF coil. For example, the accuracy of the tipping process can be measured by preparing the image with a $2N+1$ times ninety or 180° RF pulse. In FIG. 2 a 11 times ninety degree pulse was used. This is to magnify the error for ease of detection. A 9% inaccuracy in the tip of this preparation pulse will cause spins to be lined up with the polarizing field $H_o$ and result in a dark band in the image produced. This provides a quick method of checking the tipping field.

Examples of the application of the method of this invention are shown in FIGS. 3A-6. For the images, a specially fabricated circular shaped target or phantom filled with three different $Ni^{+2}$ ion doped water solutions was used. The image produced in 3A in accordance with the method of this invention shows the outline of the phantom upon which a series of light and dark bands are superimposed. These bands are 125 hertz contours of field difference.

The white area in the upper left-hand quadrant appears to be the largest area of the magnet that is homogeneous. Next to that on the left-hand side there is a black area having a different field strength, but one of uniform strength. On the right-hand side, the contours are closely spaced. The effect of this can be seen in the distortion on the right-hand side of the image of FIG. 3B.

Figure 4A:
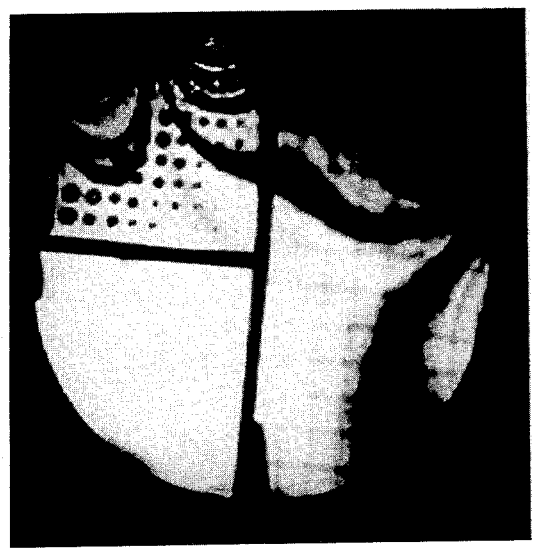
FIGS. 4A and 4B are similar to FIGS. 3A and 3B showing in FIG. 4A the contour map of the magnetic field and in FIG. 4B the image produced by conventional means so that the distortion and image can be traced to the variations in the magnetic field.
Figure 4B:
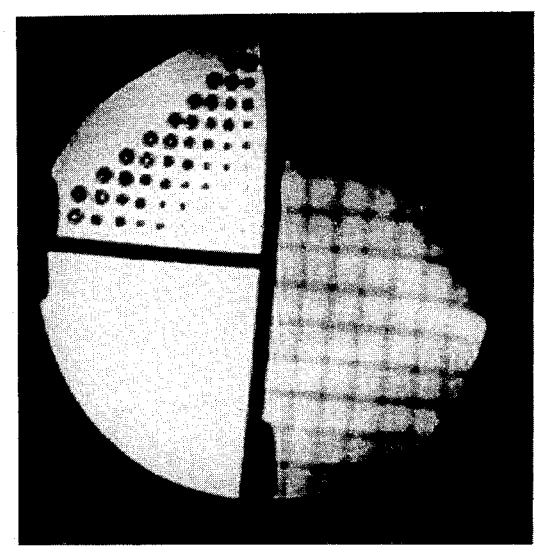

The same is true in FIG. 4A where rather steep and rapid changes in the field strength on the right-hand side shows up in the image of the phantom in FIG. 4B. The magnetic field strength is most uniform is in the lower left quadrant and this is reflected in the accurate curvature of the phantom located in this area as shown in FIG. 4B.

Figure 5:
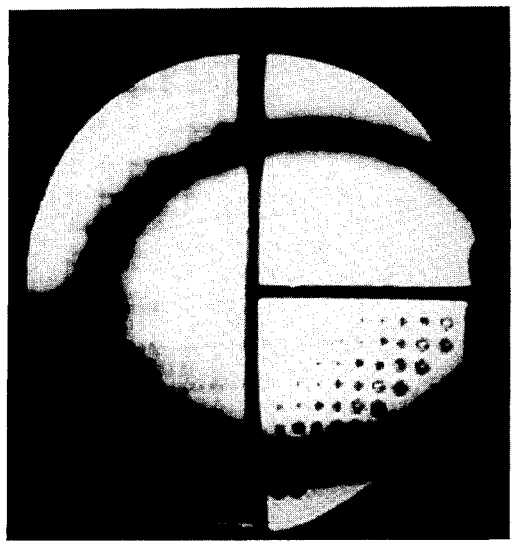
FIG. 5 is an image of a phantom where the initial preparation pulse was N times 90° in order to determine the accuracy of the RF pulse used to rotate the spins by 90°.

In FIG. 5, the spins were tipped by an RF pulse designed to rotate the spins 990° or N times 90° and then the image was obtained. The circular black band in FIG. 5 indicates that the spins were positioned more in alignment with the $H_o$ field than with the $H_1$ field. This indicates that an adjustment in the RF 90° pulse should be made. It cannot be determined from this image whether it rotates the spins too far or not far enough but it indicates that it needs correction.

Figure 6:
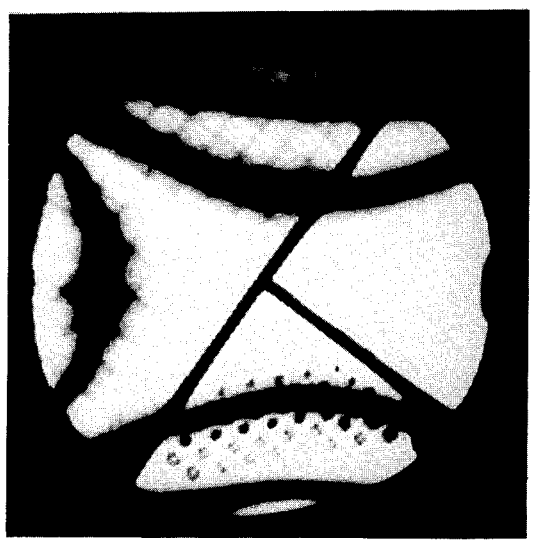
FIG. 6 is another image of the same test of the accuracy of the 90° RF pulse.

The same is true in FIG. 6 where the error is not as great but the crescent shaped bands at the top and bottom of the image indicates misalignment error.

The results obtained in FIGS. 5 and 6 could also indicate a misalignment between the physical position of the coil and the magnet. This technique can be used when constructing an NMR imagers to check on the accuracy of the physical alignment of the magnet and the coil as well as the performance of the coil.

From the foregoing it will be seen that this invention is one well adapted to attain all of the ends and objects hereinabove set forth, together with other advantages which are obvious and which are inherent to the method.

What is claimed is:

1. A method of measuring the accuracy of the tipping process of an NMR imager comprising the steps of tipping the spins through an angle equal to $2N+1$ times the angle through which the RF signal is suppose to tip the spins so that any inaccuracy is increased and will cause the spins to be moved toward alignment with the $H_o$ field and produce a dark band in the image and obtaining the image to check the accuracy of the tipping process.

2. A method of plotting the field strength contours of the magnetic field of an NMR imager comprising the steps of obtaining a coarse scale contour picture using the preparation step of 90° $T_a$ 90° and obtaining a fine contour picture that is superimposed on the first coarse scale picture with N variations of the fine contour lines between the coarse contour lines using a 90° $T_a$ 90° $T_b$ 90° preparation step, where $T_a \neq T_b$ and $T_b = N \times T_a$.

* * * * *